US011239052B2

(12) United States Patent
Yokosuka et al.

(10) Patent No.: US 11,239,052 B2
(45) Date of Patent: *Feb. 1, 2022

(54) CHARGED PARTICLE BEAM DEVICE

(71) Applicant: Hitachi High-Tech Corporation, Tokyo (JP)

(72) Inventors: Toshiyuki Yokosuka, Tokyo (JP); Chahn Lee, Tokyo (JP); Hideyuki Kazumi, Tokyo (JP); Hajime Kawano, Tokyo (JP); Shahedul Hoque, Tokyo (JP); Kumiko Shimizu, Tokyo (JP); Hiroyuki Takahashi, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/900,176

(22) Filed: Jun. 12, 2020

(65) Prior Publication Data
US 2020/0312615 A1 Oct. 1, 2020

Related U.S. Application Data

(63) Continuation of application No. 16/275,775, filed on Feb. 14, 2019, now Pat. No. 10,720,306, which is a
(Continued)

(30) Foreign Application Priority Data

Sep. 26, 2013 (JP) .................................. 2013-199130

(51) Int. Cl.
H01J 37/28 (2006.01)
H01J 37/147 (2006.01)
(Continued)

(52) U.S. Cl.
CPC ............. *H01J 37/28* (2013.01); *H01J 37/147* (2013.01); *H01J 37/20* (2013.01); *H01J 37/22* (2013.01);
(Continued)

(58) Field of Classification Search
CPC .......... H01J 37/28; H01J 37/147; H01J 37/20; H01J 37/22; H01J 2237/2803;
(Continued)

(56) References Cited

U.S. PATENT DOCUMENTS 6,232,787 B1 5/2001 Lo et al.
7,763,852 B2 7/2010 Ikegami et al.
(Continued)

FOREIGN PATENT DOCUMENTS

DE 11 2008 003 774 T5 2/2011
JP 2000-208085 A 7/2000
(Continued)

OTHER PUBLICATIONS

International Search Report (PCT/ISA/210) issued in PCT Application No. PCT/JP2014/065407 dated Sep. 9, 2014 with English-language translation (four (4) pages).
(Continued)

*Primary Examiner* — Nicole M Ippolito
*Assistant Examiner* — Hanway Chang
(74) *Attorney, Agent, or Firm* — Crowell & Moring LLP

(57) ABSTRACT

The scanning charged particle beam microscope according to the present application is characterized in that, in acquiring an image of the FOV (field of view), interspaced beam irradiation points are set, and then, a deflector is controlled so that a charged particle beam scan is performed faster when the charged particle beam irradiates a position on the sample between each of the irradiation points than when the charged particle beam irradiates a position on the sample
(Continued)

corresponding to each of the irradiation points (a position on the sample corresponding to each pixel detecting a signal). This allows the effects from a micro-domain electrification occurring within the FOV to be mitigated or controlled.

3 Claims, 8 Drawing Sheets

Related U.S. Application Data continuation of application No. 15/618,203, filed on Jun. 9, 2017, now Pat. No. 10,249,474, which is a continuation of application No. 15/023,936, filed as application No. PCT/JP2014/065407 on Jun. 11, 2014, now Pat. No. 9,697,987.

(51) Int. Cl.
*H01J 37/20* (2006.01)
*H01J 37/22* (2006.01)

(52) U.S. Cl.
CPC .......... *H01J 2237/2803* (2013.01); *H01J 2237/2806* (2013.01); *H01J 2237/2817* (2013.01); *H01J 2237/2826* (2013.01); *H01J 2237/3045* (2013.01)

(58) Field of Classification Search
CPC ....... H01J 2237/2806; H01J 2237/2817; H01J 2237/2826; H01J 2237/3045
See application file for complete search history.

(56) References Cited

U.S. PATENT DOCUMENTS

| | | |
|---|---|---|
| 9,697,987 B2 | 7/2017 | Yokosuka et al. |
| 10,249,474 B2 | 4/2019 | Yokosuka et al. |
| 10,720,306 B2 * | 7/2020 | Yokosuka ............... H01J 37/20 |
| 2002/0149381 A1 | 10/2002 | Lo et al. |
| 2010/0163727 A1 | 7/2010 | Bell et al. |
| 2011/0049362 A1 | 3/2011 | Matsumoto et al. |
| 2011/0163230 A1 | 7/2011 | Hiroi et al. |
| 2013/0306866 A1 | 11/2013 | Hoque et al. |

FOREIGN PATENT DOCUMENTS

| | | |
|---|---|---|
| JP | 2000-208579 A | 7/2000 |
| JP | 2002-353279 A | 12/2002 |
| JP | 4914180 B2 | 4/2012 |
| JP | 2012-156076 A | 8/2012 |
| JP | 5341924 B2 | 11/2013 |
| WO | WO 2010/029700 A1 | 3/2010 |

OTHER PUBLICATIONS

German-language Office Action issued in counterpart German Application No. 112014003984.5 dated Oct. 31, 2019 with English translation (nine (9) pages).

* cited by examiner

Top View

Side View
(A-A')

PIXEL COORDINATES WITHIN BLOCK

■ DETECTION ELECTRON IMAGE (a) NORMAL (b) 4×4 BLOCK

SEM IMAGE

CHARGED PARTICLE BEAM DEVICE

CROSS REFERENCE TO RELATED APPLICATIONS

This application is a continuation of U.S. application Ser. No. 16/275,775, filed Feb. 14, 2019, which is a continuation of U.S. application Ser. No. 15/618,203, filed Jun. 9, 2017, which is a continuation of U.S. application Ser. No. 15/023,936, filed Mar. 22, 2016, which is a 371 of International Application No. PCT/JP2014/065407, filed Jun. 11, 2014, which claims priority from Japanese Patent Application No. 2013-199130, filed Sep. 26, 2013, the disclosures of which are expressly incorporated by reference herein.

TECHNICAL FIELD

The present invention relates to a charged particle beam device, particularly, a charged particle beam device that generates image data or signal waveform data by scanning a beam.

BACKGROUND ART

With minuteness of a semiconductor pattern, a slight shape difference affects an operation characteristic of a device and needs for shape management increase. For this reason, in a scanning electron microscope (SEM) used for inspecting and measuring a semiconductor, high sensitivity and high precision are required increasingly. In the SEM, when an electron beam irradiates a sample, secondary electrons emitted from the sample are detected and a shape of a surface is observed. At this time, the detected secondary electrons have low energy and are affected by electrification of the sample. Due to recent minuteness of a pattern or a use of a low permittivity material such as low-k, effects from the electrification become obvious and it may become difficult to capture a signal of a place where management is necessary.

In this case, because the energy of the secondary electrons emitted at the time of irradiation of the electron beam does not change, changing of the state of the electrification of the sample surface becomes a solution. A method of changing an irradiation current amount and improving a detection rate of a foreign material is disclosed in PTL 1. In addition, a method of changing a scan interval of an electron beam according to electrification time constant of an observed sample and suppressing electrification of a surface is disclosed in PTL 2. A method of changing a scan speed of a partial area in a field of view (FOV) and controlling an electrification state distributed on a surface is disclosed in PTL 3.

CITATION LIST

Patent Literature

PTL 1: Japanese Patent Application Laid-Open No. 2002-353279
PTL 2: Japanese Patent No. 4914180 (U.S. Pat. No. 7,763,852)
PTL 3: Japanese Patent No. 5341924 (WO2012/102301A)

SUMMARY OF INVENTION

Technical Problem

As described in PTL 1 and PTL 2, the electrification of the surface is controlled by changing observation conditions such as the irradiation current and the energy of the irradiated primary electron and an interval (Y direction) between scan lines and a signal amount of an observation place can be optimized. In an actual sample, effects from the electrification of a minute area are viewed due to minuteness or lamination of a plurality of materials and the effects from the electrification of the minute area may be left in only optimization between the scan lines.

In addition, a pre-dose method of scanning an inner area faster than an outer area in a scan area and reducing an electrification amount of the inner area relatively, when beam scan (pre-dose scan) for the electrification is executed on the sample, is described in PTL 3. However, the effects from the electrification in the minute area may be left.

Hereinafter, a charged particle beam device to realize mitigation of effects from electrification in a minute area or control thereof will be described.

Solution to Problem

As an aspect for achieving the object, there is proposed a charged particle beam device, including: a charged particle source; a deflector which scans a sample with a charged particle beam emitted from the charged particle source; an image memory which stores signals obtained by scan of the charged particle beam for the sample; and a control device which controls the deflector, wherein the control device controls the deflector so that scan of the charged particle beam between individual pixels is performed faster when the charged particle beam irradiates a position on the sample corresponding to each pixel.

Further, as another aspect for achieving the object, there is proposed a charged particle beam device, including: a charged particle source; a deflector which scans a sample with a charged particle beam emitted from the charged particle source; an image memory which stores signals obtained by scan of the charged particle beam for the sample; and a control device which controls the deflector, wherein, when at least one of a scan speed and an irradiation point interval at the time of scan of the charged particle beam is set to at least two states, the control device evaluates signals obtained in each state and selects at least one of the scan speed and the irradiation point interval where an evaluation result satisfies a predetermined condition.

Advantageous Effects of Invention

According to the above configuration, mitigation of effects from electrification in a minute area in an FOV or control of the electrification in the minute area can be performed.

DESCRIPTION OF EMBODIMENTS

In an embodiment to be described below, a charged particle beam device in which a beam scan speed and an interval between irradiation points at the time of scanning a beam are appropriately adjusted to mitigate effects from electrification in a unit of a minute portion in an FOV will be mainly described. In addition, a charged particle beam device that can fine an optimal condition of at least one of the scan speed and the interval between the irradiation points will be described.

In the embodiment to be described below, a charged particle beam device which includes an objective lens to focus a charged particle beam emitted from a charged particle source, a deflector to change a scan position of the charged particle beam, a control device to control the scan deflector, a sample stage to mount a sample, and a detector to detect a charged particle emitted from the sample and in which a plurality of data are acquired by repetitively changing a scan speed and an interval of irradiation points of the charged particle beam and observation conditions of a measurement portion are selected from the data, as a condition setting operation for setting the observation conditions before a regular observation, will be described.

A signal amount or a contrast ratio of the measurement portion can be improved by setting the observation conditions on the basis of detected conditions while changing the scan speed and the interval of the irradiation points.

Figure 1:
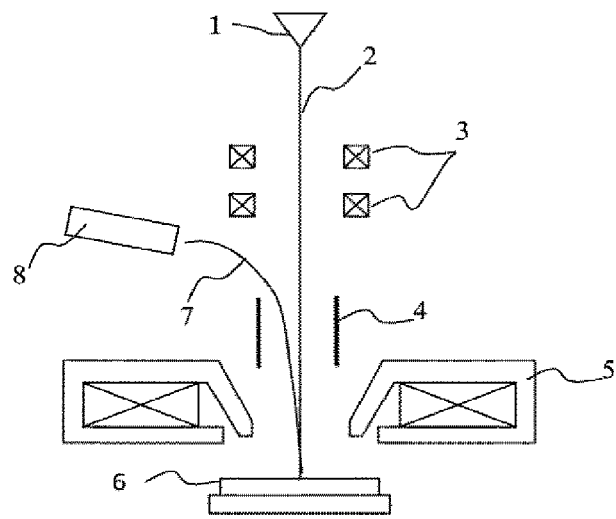
FIG. 1 is a diagram illustrating an outline of a scanning electron microscope.

FIG. 1 illustrates a schematic diagram of a scanning electron microscope (SEM) to be a type of the charged particle beam device. An electron beam 2 generated by an electron gun 1 is focused by condenser lenses 3 and is finally focused on a sample 6 by objective lenses 5. An electron beam scan area of the sample is scanned with the electron beam 2 by a deflector 4. A primary electron is scanned two-dimensionally and is excited in the sample by irradiation, a secondary electron 7 emitted from the sample is detected by a detector 8, and a signal of an electron is converted into an image, so that the sample is observed and measured. The SEM illustrated in FIG. 1 includes an image memory to store a detection signal for each pixel and the detection signal is stored in the image memory.

When the sample is a dielectric, a two-dimensional electrification distribution is formed in a scan area (FOV) during SEM observation. Because electrons mainly detected by the SEM are secondary electrons having a large emission amount and small energy (several eV), the electrons are affected by slight electrification formed on a surface. For this reason, in the SEM observation of the sample to be electrified, an obtained image changes according to an electrification distribution formed at the time of irradiation. As parameters to determine the electrification distribution of the surface, there are energy of the primary electron affecting an emission amount of the secondary electron, a current amount, and scan order and a scan speed of electron beams.

The primary electron energy and the current amount affecting the electrification of an irradiation place are main parameters of an observation condition search. When the sample surface is a uniform material, the emission amount of the secondary electron is also constant and electrification control is relatively easy. However, with recent complication of a device structure, a pattern is often formed by combining various materials and it becomes difficult to execute the electrification control by only the primary electron energy and the current amount. Meanwhile, the scan order and the scan speed are parameters including an effect of mitigation of electrification accumulated by irradiation and the present inventors have recognized that optimization of the parameters are important for measurement or inspection, by an examination.

With minuteness of a semiconductor device, effects from the electrification of the sample on an image appear notably. In the SEM according to the related art, scan of an electron beam is generally performed in one direction with XY. However, due to effects from the electrification within the FOV, a detection signal amount of an observation place may be small or a signal may be detected, but contrast with a surrounding pattern may not be taken. For a pattern in which an aspect ratio (=depth/hole diameter (or groove width)) is large, such as a deep hole and a deep groove, a method of increasing a detection amount of the secondary electron using positive electrification is taken. However, an image of a hole bottom or a groove bottom may be distorted by a distribution of the positive electrification.

To suppress occurrence of such a phenomenon, it may be effective to control an electrification distribution of the sample surface. However, a shape and a dimension of an observation pattern included in an irradiation area are not constant and a long time is necessary for searching an optimal scan method. For a material to form a pattern, an electrification characteristic may be different according to a difference of manufacturing processes. Observation may be easy in a wafer of a certain process, but the observation may be difficult in a different process.

Hereinafter, a scan condition determination method of improving the detection signal amount or the contrast ratio of the observation area by changing the scan speed and the interval of the irradiation points of the electron beam according to the observation pattern will be described using the drawings. Particularly, in this embodiment, a method of searching conditions where the signal amount or the contrast ratio is optimized by changing the two parameters of the scan speed and the interval of the irradiation points will be described.

Figure 2:
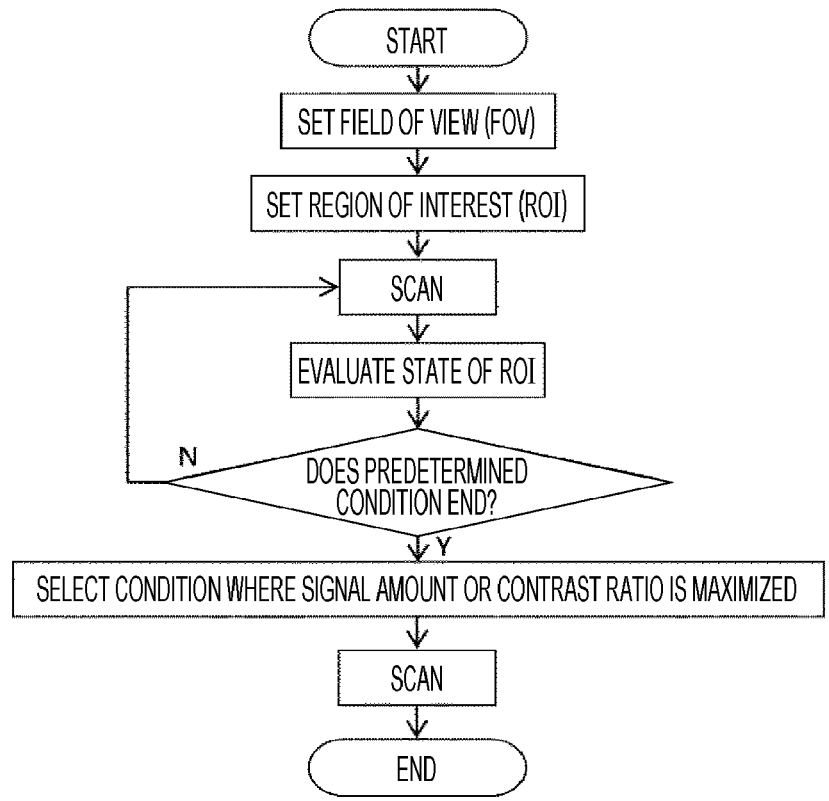
FIG. 2 is a flowchart illustrating a process for setting observation conditions according to a region of interest (ROI).

FIG. 2 illustrates a flowchart for setting the observation conditions. First, an irradiation area (FOV) at the time of observation is set such that an observation pattern is included. Here, an observation magnification and an observation angle (angle of the FOV to an observation pattern are designated. Next, an area (ROI) for measurement (management) is designated in the FOV.

Here, any one of a mean signal amount (brightness) of the ROI, contrast ratio with a separately designated place, contrast to noise ratio (CNR) with a separately designated place, and a shrinkage amount of a separately designated area is designated for an index for optimization. When the contrast ratio is designated, an area to calculate the ROI and the contrast ratio is additionally designated. The CNR shows the magnitude of the contrast of the ROI to noise and a noise determination area is designated in addition to the area to calculate the contrast ratio. When the shrinkage amount is designated as the index, an area to determine the shrinkage amount and an allowable value of the shrinkage amount are designated. A shape may be deformed by damage due to irradiation of the electron beam, depending on materials, and an observation condition search with small damage is enabled by setting the shrinkage amount as the index. The scan speed and the interval of the irradiation points are changed with respect to the designated FOV, according to predetermined conditions, and scan is performed. Here, the scan speed corresponds to a scan speed in the FOV and the interval of the irradiation points corresponds to a division number of each of an X direction and a Y direction in the FOV. When the division number increases, the interval of the irradiation points decreases. For example, in the case in which the FOV is scanned with 512×512 pixels, if the division number of each of X and Y is 512, the interval of the irradiation points becomes 1 (continuous). An index value (any one of the mean signal amount, the contrast ratio, the CNR, and the shrinkage amount) is extracted from an image obtained as a result of each scan.

Figure 3:
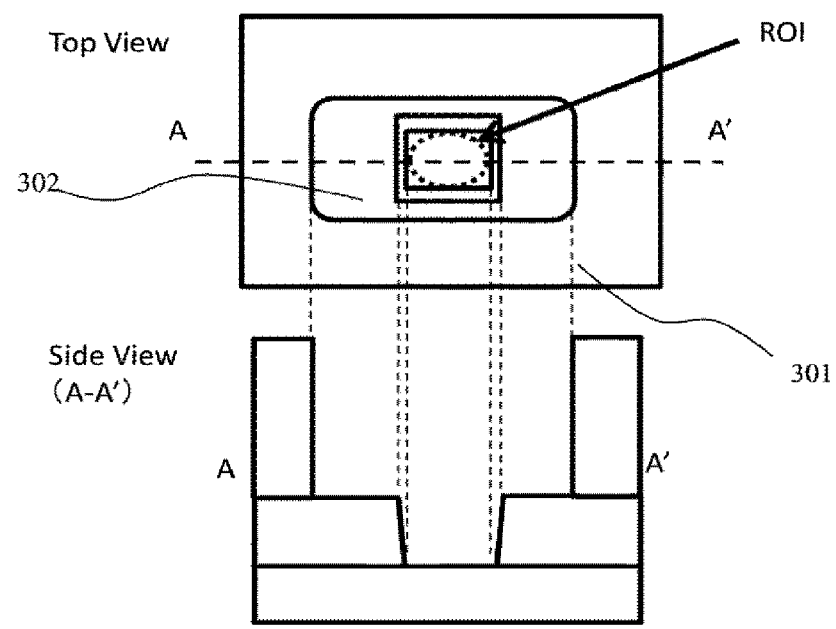
FIG. 3 is a diagram illustrating an example of a screen displaying an evaluation result of an image quality of the ROI for each combination of a scan speed and an interval of irradiation points.
Figure 3:
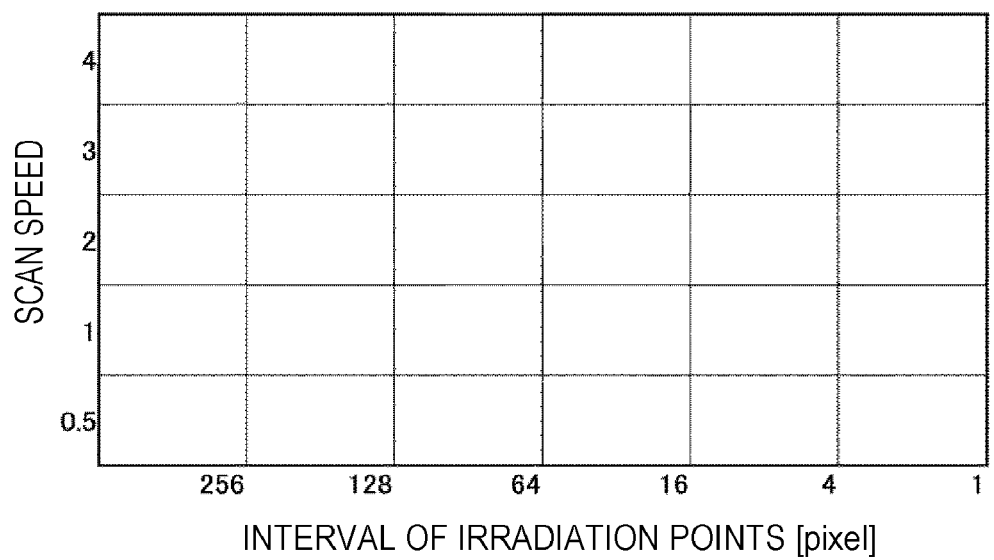

The obtained result is represented by a two-dimensional map exemplified in a lower diagram of FIG. 3. In this example, an example of the case of extracting measurement conditions for the via/trench pattern exemplified in an upper diagram of FIG. 3 will be described. In this example, an example of the case in which the via bottom is set as the ROI to measure a radius of the via bottom as the measurement target and the signal amount (brightness) or the contrast (for example, a brightness difference with the other designation portion) of the corresponding portion is detected will be described. The via exemplified in the upper diagram of FIG. 3 is configured by laminating an upper layer line pattern 301 on a lower layer pattern 302. Axes of the map are the scan speed and the interval of the irradiation points and display index values of the individual conditions. In addition, each box of the map is displayed at brightness according to the obtained signal amount or contrast ratio. For example, when a color of the map is bright, the signal amount or the contrast ratio is high. By performing such display, a combination of the appropriate scan conditions can be easily detected.

In addition, conditions in which an index value is largest (for example, boxes in which the brightness or the contrast is highest) can be automatically set from the map. However, an operator may select a condition from the obtained map. The operator can display scan order of the selected conditions (numbers of pixels to be scanned or a change of irradiation points by animation) and confirm the scan order. Observation conditions for the obtained scan speed and irradiation point interval are stored in a hard disk or a memory of the device and measurement is executed by reading the stored observation conditions.

The observation conditions can be read even in image acquisition by a recipe and an observation under the same conditions is enabled by positioning the observation pattern by addressing. According to this embodiment, even in the ROI in which it is difficult to extract the shape or the material contrast, it can be determined whether there are optimal observation conditions. For example, in a semiconductor manufacturing process, high-precision and effective process management is enabled.

Next, a method of setting the scan order when the interval of the irradiation points is increased will be described below. The interval of the irradiation points can be set by dividing the FOV into M×N blocks in X and Y directions. Here, the division is executed in a pixel unit of an image. In addition to setting the division number from the pixel number of the acquired image, the FOV and the pixel number of the acquired image may be set on the basis of the block size and the pixel number.

Figure 4:
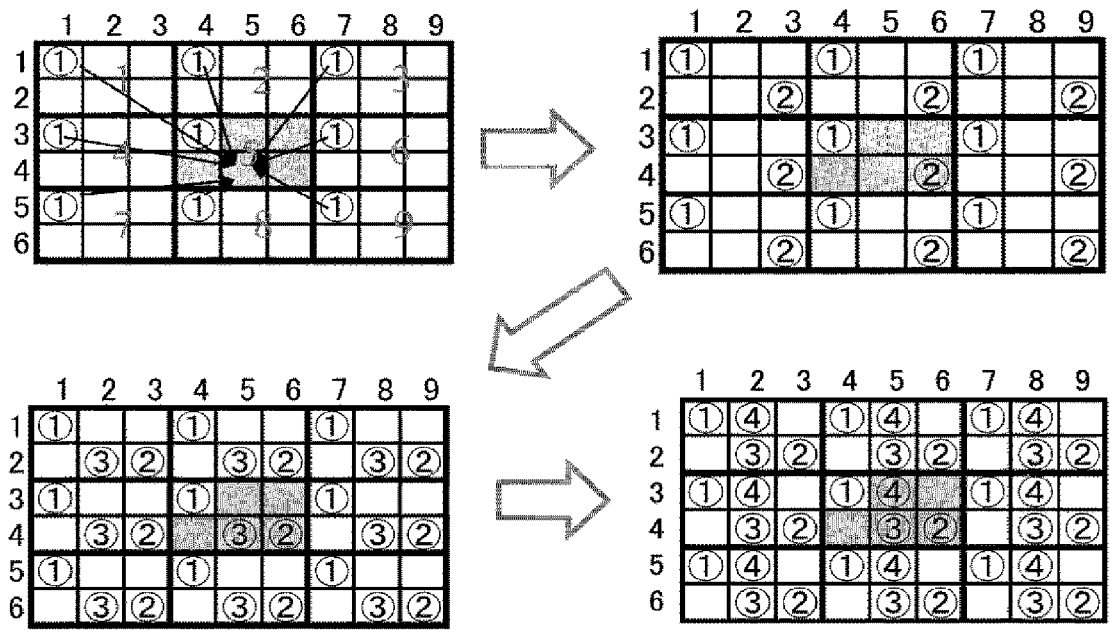
FIG. 4 is a diagram illustrating irradiation order of beams when an FOV is divided in a block shape.

FIG. 4 illustrates an example of the case in which an image of 6×9 pixels is divided into 3×3 blocks. Here, the case in which scan starts from an upper left block 1 with respect to the 3×3 blocks is illustrated. First, an upper left pixel "1" of the block 1 is irradiated. In each block, because the same place is irradiated, a block size is matched with the interval of the irradiation points. In each block, the pixel "1" is irradiated. Then, after returning to the block 1, a lower right pixel "2" in the block is irradiated. Here, as a reference to select the pixel "2", a distance with the previously irradiated pixel "1" of each block is calculated and a pixel in which effects from the electrification are minimized is selected. Here, a next irradiation block is the block 1. However, pixel selection in the block evaluates an influence under a condition where a block exists in a surrounding portion (for example, a fifth block of FIG. 4). Effects from an irradiated pixel and a previously irradiated pixel are represented by the following formula (1). When a plurality of materials exist in the FOV or shapes (heights) are different, a weight coefficient of the electrification may be applied. Here, a distance with a (1, 1) pixel "1" of each block is calculated and a pixel in which the distance is largest is set as a next irradiation point.

$$F(i, j) = \sum_{k=1}^{9} \frac{1}{R((1, 1)_k - (i, j))^2} \quad (1)$$

After the pixel "1" of each block to be a second irradiation point is irradiated, a third irradiated pixel is calculated on the basis of the following formula (2). In addition to the distance with the previous irradiated pixel, a coefficient of mitigation by a time is applied. This is to distinguish influences of the electrification in the immediately previously irradiated pixel "2" and the pixel "1" irradiated before the pixel "2". Here, a mitigation coefficient t of the electrification can be set by the operator. Likewise, a fourth irradiated pixel is calculated by the following formula (3).

$$F(i, j) = \sum_{k=1}^{9} \frac{1}{R((3, 2)_k - (i, j))^2} + t \sum_{k=1}^{9} \frac{1}{R((1, 1)_k - (i, j))^2} \quad (2)$$

$$F(i, j) = \sum_{k=1}^{9} \frac{1}{R((2, 2)_k - (i, j))^2} + t \sum_{k=1}^{9} \frac{1}{R((3, 2)_k - (i, j))^2} + t^2 \sum_{k=1}^{9} \frac{1}{R((1, 1)_k - (i, j))^2} \quad (3)$$

The above processing is executed on all pixels of each block and the irradiation order in the FOV is determined. When weighting of the material characteristic or the shape is not performed, the irradiation order is determined by a pixel number of a block. Therefore, the irradiation order corresponding to the block size may be previously tabulated.

<Scan Signal>

Figure 5:
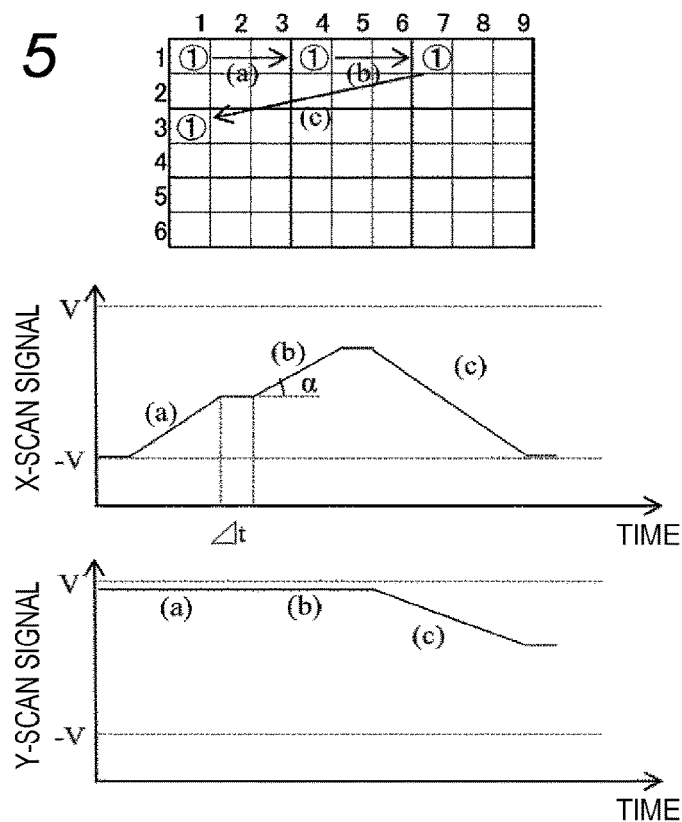
FIG. 5 is a diagram illustrating an example of a scan signal supplied to a deflector.

A scan signal when discontinuous irradiation illustrated in FIG. 4 is performed is exemplified in FIG. 5. FIG. 5 illustrates transitions of an X-scan signal and a Y-scan signal when pixels from the pixel 1b "1" of the block 1 of FIG. 4 when a time t is set as a horizontal axis to a pixel "1" of a block 4 are scanned with an electron beam (movements between individual pixels are described as (a), (b), and (c)). In FIG. 5, V shows a maximum deflection voltage in X and Y directions. In this example, because an example of adopting an electrostatic deflector is described, a deflection signal is displayed with a voltage value.

An irradiation time of pixels is set as Δt and electrons emitted in the irradiation time of Δt are detected. An inclination α of a scan signal shows a scan speed and when the inclination is large, the movement speed of the electron beam is high. The movement between the pixels has the inclination α larger than the inclination in normal scan and when the inclination is large, the movement speed of the electron beam is high. Therefore, the number of electrons irradiated at the time of the movement between the pixels can be reduced. The movement speed may be calculated from the irradiation current amount and the interval (distance ΔL) of the irradiation points. In addition, a change of the scan time to be the parameter corresponds to a change of the pixel irradiation time Δt. By changing Δt and ΔL, an image is acquired. Irradiation of the electron beam based on a point is enabled by using the XY scan signals and an electrification state of the surface can be controlled by a material and a structure of the sample.

As described using FIG. 5, the scan speed of the beam scan at the time of the movement between the pixels is set to a high speed with respect to the beam scan when a signal is detected (sampled), so that effects from the electrification by the beam scan can be mitigated while a necessary signal is secured. Particularly, when a plurality of pixels are skipped and scanned, the same scan line orbit is scanned with a beam several times to obtain a signal of one frame. For this reason, this method of maximally suppressing the beam irradiation not used for signal acquisition is very effective.

According to the scan using the scan signal exemplified in FIG. 5, both mitigation of accumulation of the electrification by irradiating the adjacent portion with the beam continuously and mitigation of accumulation of the electrification by scanning the same scan orbit with the beam several times can be realized.

<Cooperation with Design Data>

Figure 6:
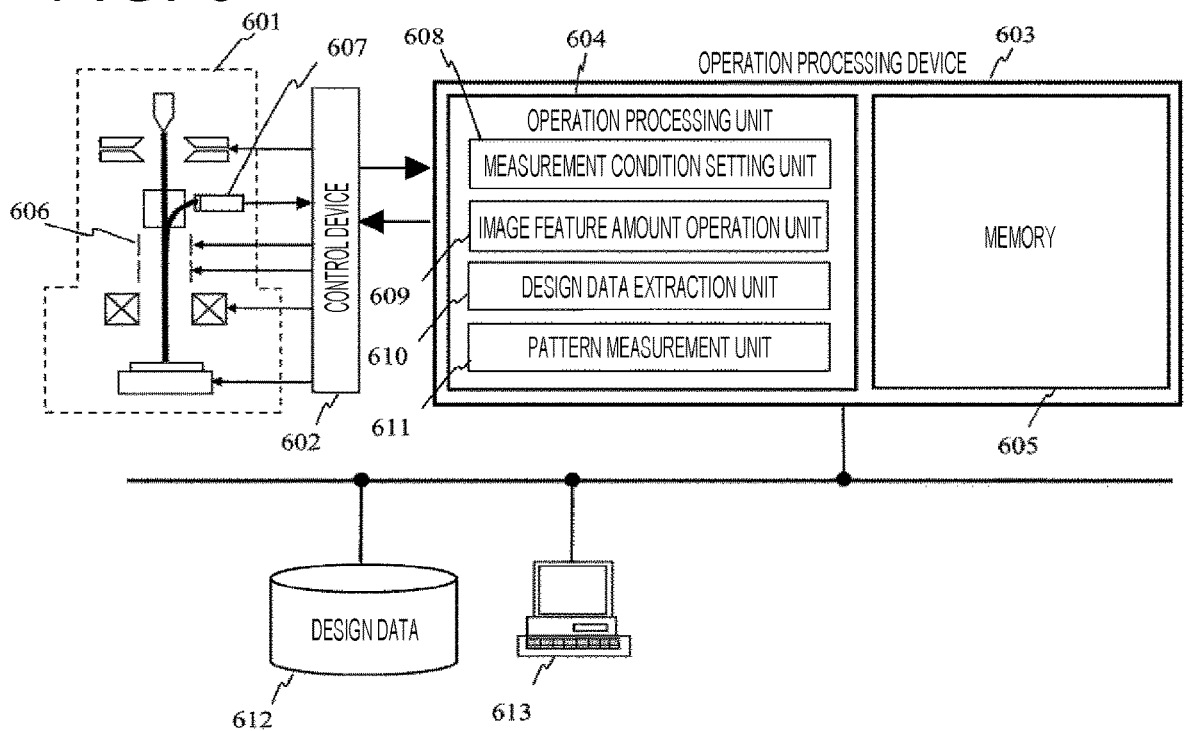
FIG. 6 is a diagram illustrating an example of a semiconductor measurement system including the scanning electron microscope.

A control device of the scanning electron microscope has a function of controlling each configuration of the scanning electron microscope and forming an image on the basis of detected electrons or a function of deriving a mean signal amount or a contrast ratio of a preset ROI, on the basis of a strength distribution of the detected electrons. FIG. 6 illustrates an example of a pattern measurement system including an operation processing device 603.

In this system, a scanning electron microscope system including a SEM body 601, a control device 602 of the SEM body, and the operation processing device 603 is included. In the operation processing device 603, an operation processing unit 604 supplying a predetermined control signal to the control device 602 and executing signal processing of a signal obtained by the SEM body 601 and a memory 605 storing obtained image information or recipe information are embedded. In this embodiment, the control device 602 and the operation processing device 602 are described as separated elements, but may be an integrated control device.

Electrons emitted from the sample by beam scan by the electrostatic deflector 606 or electrons generated by a conversion electrode are captured by a detector 607 and are converted into a digital signal by an A/D converter embedded in the control device 602. Image processing according to an object is executed by image processing hardware such as a CPU, an ASIC, and an FPGA embedded in the operation processing device 602.

A measurement condition setting unit setting measurement conditions such as the scan conditions of the electrostatic deflector 606, on the basis of measurement conditions input by an input device 613, a measurement condition setting unit 608 setting the measurement conditions such as scan conditions, and an image feature amount operation unit 609 calculating brightness or contrast in the ROI input by the input device 613 from obtained image data are embedded in the operation processing unit 604. In addition, a design data extraction unit 610 reading design data from a design data storage medium 612 under conditions input by the input device 613 and converting vector data into layout data according to necessity is embedded in the operation processing unit 604. In addition, a pattern measurement unit 611 measuring a dimension of a pattern, on the basis of an acquired signal waveform, is embedded. In the pattern measurement unit 611, a line profile is formed on the basis of a detection signal and dimension measurement between peaks of a profile is executed.

A GUI displaying an image or an inspection result to the operator is displayed on a display device provided in the input device 613 connected to the operation processing device 603 via a network.

A part or an entire portion of the control and the process in the operation processing device 603 are allocated to an electronic computer mounted with a CPU and a memory in which images can be accumulated and the process/control can be executed. In addition, the control device 602 and the operation processing device 603 may be configured as one operation device. In addition, the input device 613 also functions as an imaging recipe creation device that sets measurement conditions including the coordinates of an electronic device necessary for inspection, types of patterns, and imaging conditions (an optical condition or a movement condition of a stage) as an imaging recipe. In addition, the input device 613 has a function of collating input coordinate information and information regarding the types of the patterns with layer information of design data and identification information of the patterns and reading necessary information from the design data storage medium 612.

The design data stored in the design data storage medium 612 is expressed in a GDS format or an OASIS format and is stored in a predetermined format. In addition, software displaying the design data can display a format thereof. If the design data can be handled as figure data, a type thereof does not matter. In addition, the figure data may be changed to segment image information showing an ideal shape of a pattern formed on the basis of the design data and may be the segment image information obtained by performing exposure simulation and executing deformation processing to approach an actual pattern.

In the measurement condition setting unit 608, appropriate scan conditions are set by the step exemplified in FIG. 2. For example, the magnitude of the FOV, a position (the coordinates) of the FOV, the magnitude of the ROI, and a position of the ROI are set to layout data in the vicinity of a measurement target pattern extracted by the design data extraction unit 610, using the input device 613, so that operation conditions of the device are automatically set. More specifically, an FOV position for each combination of a plurality of scan speed conditions and a plurality of irradiation point interval conditions is determined. At this time, a pattern structure in the FOV is the same and a plurality of areas at different positions are selected and are registered as the FOV.

In the design data extraction unit 610, the design data is read from the design data storage medium 612 according to the conditions input by the input device 613 and the vector data is converted into the layout data according to the necessity, so that setting of the FOV or the ROI on the layout data is enabled.

In the measurement condition setting unit 608, the scan speed and the irradiation point interval are changed. In addition, the image feature amount operation unit 609 extracts signal information of the ROI from the acquired image and generates a display signal of the input device 613. The image feature amount operation unit 609 derives the index values (the mean detection signal amount and the contrast ratio with a designation portion) of the ROI set previously for each scan condition, on the basis of the detection signal, and displays a map of the index values to the scan speed and the irradiation point interval exemplified in FIG. 3 on a display screen of the input device 613.

Figure 7:
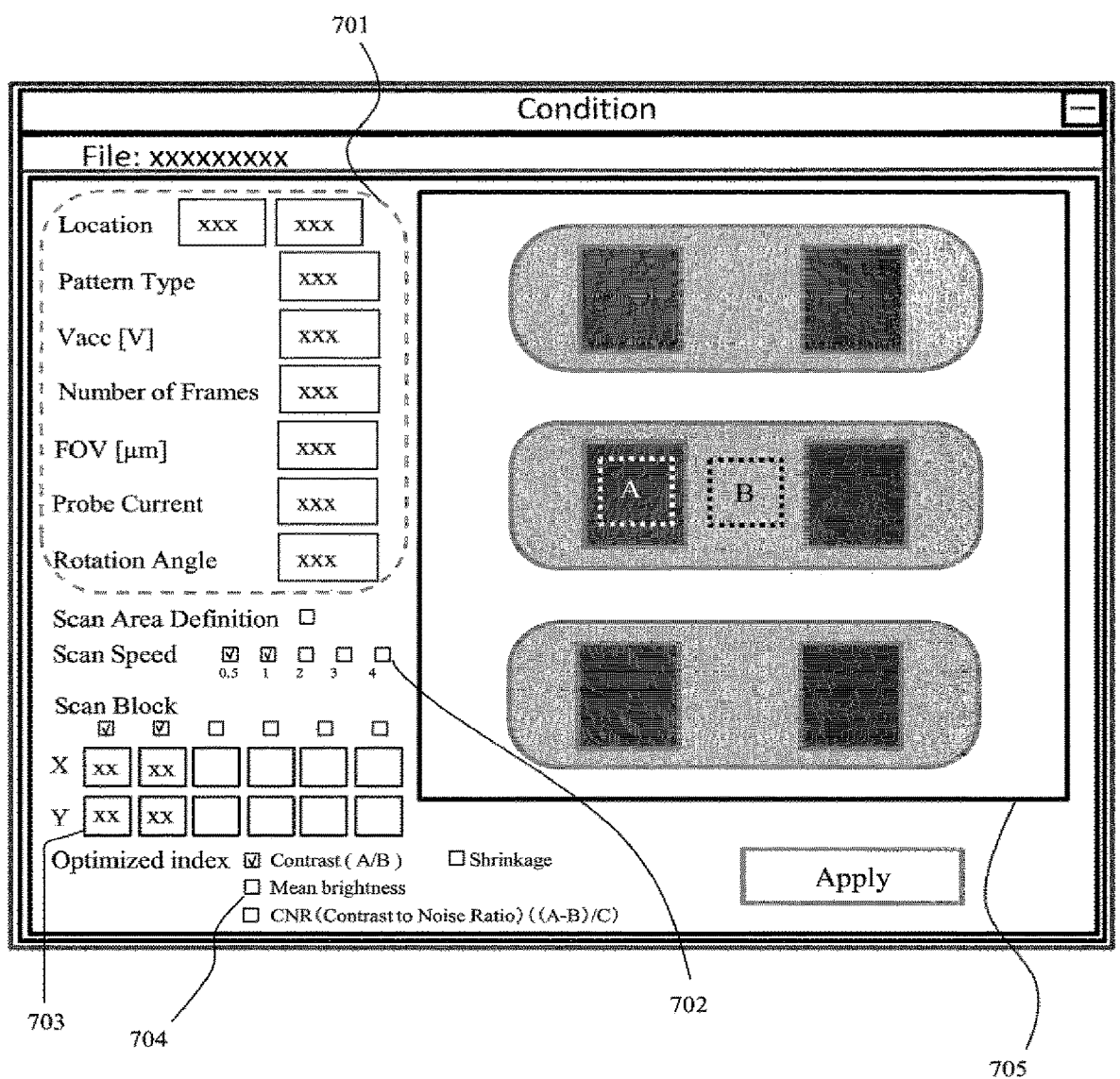
FIG. 7 is a diagram illustrating an example of a graphical user interface (GUI) to set a region of interest (ROI) of an observation pattern.

The designation of the ROI is performed on the previously acquired image (or the layout data). The ROI is set by designating any two-dimensional area on the image. FIG. 7 is a diagram illustrating an example of a GUI screen to set the operation conditions of the SEM. Particularly, a setting unit to set the operation conditions of the SEM when the scan is performed to select the appropriate scan condition from the plurality of scan conditions is provided in the GUI screen exemplified in FIG. 7. A plurality of windows to set beam conditions are provided in a beam condition setting window 701. In an example of FIG. 7, Location (coordinates), Pattern Type (type of a pattern), Vacc (acceleration voltage of a beam), Number of Frames (number of integration frames), FOV (magnitude of the FOV), Probe Current (beam current), and Rotation Angle (scan direction) can be set.

In addition, a scan speed setting unit 702, a scan block setting unit 703, and an image evaluation parameter selection unit 704 are provided on the GUI screen exemplified in FIG. 7. In the scan speed setting unit 702, a plurality of scan speeds can be selected and in the measurement condition setting unit 608, scan conditions are set according to the number of set scan speeds or a combination of the number of set scan speeds and the irradiation point interval and are registered in the memory 605. In the scan block setting unit 703, the coordinates of an area to be set as the ROI are set. In addition, although not illustrated in the drawings, a setting unit of the irradiation point interval conditions may be provided and a desired irradiation point interval may be selected. In addition, only the designated ROI can be irradiated by checking a check box of Scan Area Definition. In addition, in the image evaluation parameter setting unit 704, it is determined which parameter is used to evaluate the ROI to be evaluated. In the GUI screen exemplified in FIG. 7, two parameters of the contrast of the ROI to be measured and other ROI and the brightness of the ROI can be selected. The ROI can be set by a setting screen 705. A parameter for evaluating the ROI may be a resolution evaluation value such as sharpness in the ROI. According to an object of the measurement or the inspection, other image evaluation parameter may be selected.

For example, as illustrated in FIG. 7, it is assumed that an observation target is a via in a trench. At this time, when a signal amount of a bottom of the via needs to be increased, the bottom of the via is designated as the ROI by a cursor box. At this time, there is a contrast ratio of the ROI and a surrounding portion or a mean signal amount (brightness) of the ROI as an optimization index. When the contrast is selected, an area B to compare the brightness is designated by the operator using the cursor box. The index value is acquired by changing a scan speed and an irradiation interval (scan block). For the scan speed and the block number, necessary conditions are set by the operator. A plurality of conditions can be set with the scan speed and the block number.

As described above, effects from the electrification are suppressed by evaluating the parameters of the ROI for each of the scan speed and/or the irradiation point interval and fining an appropriate scan condition and high-precision measurement can be performed.

Figure 8:
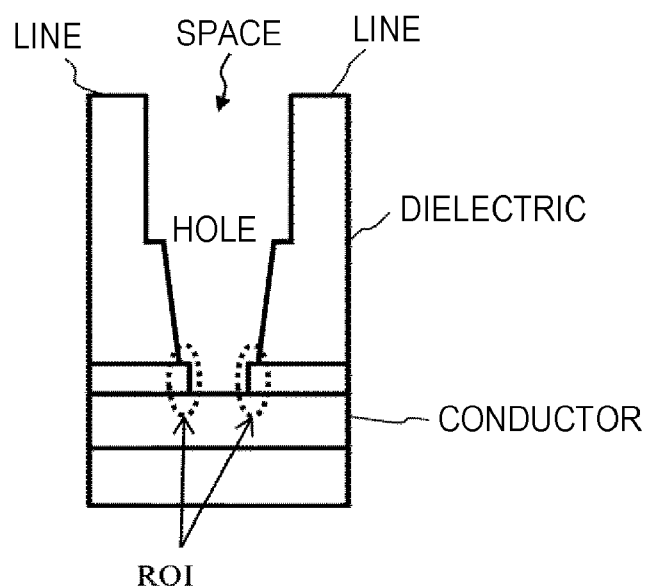
FIG. 8 is a diagram illustrating an example of an image when a via/trench pattern is normally scanned and an image obtained when block scan is performed.
Figure 8:
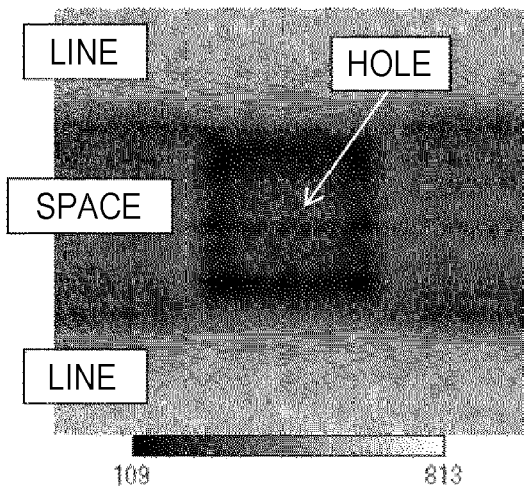
Figure 8:
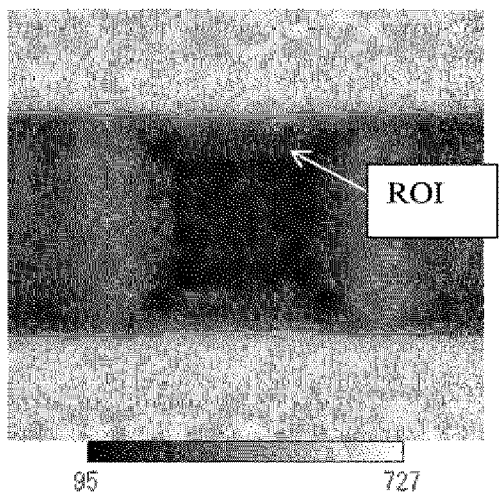

A specific example of changing the irradiation point interval and increasing a signal amount of a specific portion will be described below. FIG. 8 illustrates a simulation result obtained by observing a via-in-trench shape in which a via exists in a trench. Here, the ROI is contrast of a shape in a via bottom. A pattern is irradiated with an electron beam, electrons detected from a sample are counted for each pixel, and a detection electron image is formed. In addition, in the simulation, influences of the electrification by a primary electron and a secondary electron are considered.

In (a) of FIG. 5, a contour of a hole bottom formed in a space cannot be determined in scan ($-X \to +X$ and $+Y \to -Y$) of a normal direction. Meanwhile, the FOV is divided into 4×4 blocks and electron beam irradiation is performed.

In (b) of FIG. 5, the contour of the hole bottom can be determined and contrast of the hole bottom to be the ROI increases. This shows that the electrification of the surface is mitigated by changing the interval of the irradiation points and observation condition optimization according to an observation place is effective. In a structure illustrated in this embodiment, a space and a line are configured using a dielectric and a characteristic of the electrification is changed by a manufacturing process. In this case, the observation conditions are optimized in only the first in a wafer to perform observation, so that the same conditions can be reflected in the following observation. In addition, a material characteristic of the sample such as the mitigation of the electrification can be predicted from the change in the scan speed or the irradiation point interval.

Next, an example of changing the scan speed in the ROI and the other area will be described using the drawings. In the embodiment described above, as exemplified in (a) of FIG. 5, an example of controlling the deflector so that the scan of the charged particle beam between the individual pixels is performed faster than when position on a sample corresponding to each pixel is irradiated with a charged particle beam (in the example of FIG. 5, a speed is zero) has been described. This is to realize both securing of a signal necessary for measurement and accumulation of the electrification by performing the scan at a low speed (including a stop) to increase the irradiation amount of the beam in a place (portion corresponding to each pixel) to extract a signal and performing the scan at a high speed to suppress the accumulation of the electrification in the other place. Meanwhile, in a critical dimension-SEM (CD-SEM) to measure a pattern width, information of an edge portion to measure the pattern width is very important, but the other portion is not so important. Therefore, a scan method of realizing both high precision of the measurement and reduction of effects from the electrification by scanning the ROI portion necessary for the measurement at a low speed and scanning the other portion at a high speed will be described hereinafter.

Figure 9:
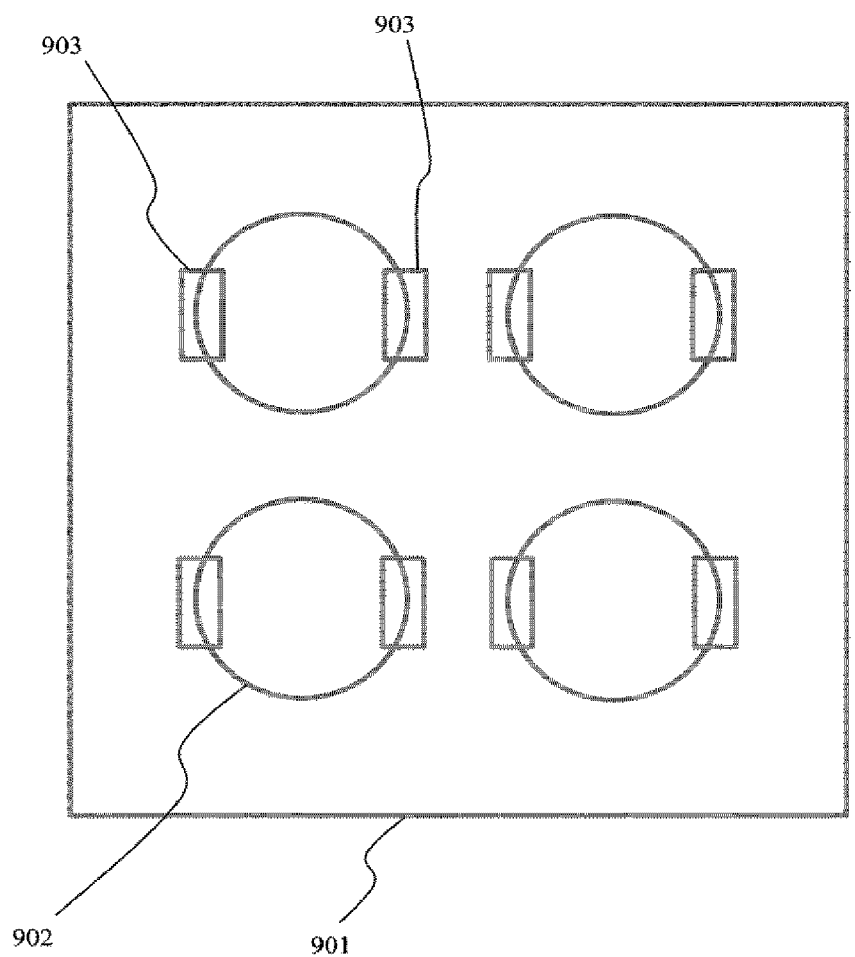
FIG. 9 is a diagram illustrating an example of an image in which a measurement target in the FOV is set as a low-speed scan area and the other area is set as a high-speed scan area.

FIG. 9 illustrates an example of the case in which four hole patterns 902 exist in an FOV 901. Here, when a diameter of an X direction of the hole pattern 902 is measured, it is necessary to increase S/N of at least left and right edges of the hole pattern. Meanwhile, for the other area, a shape may be determined to some degree. From the viewpoint of suppressing the electrification in the FOV, non-irradiation of the beam is preferable.

Therefore, a method of realizing both suppression of the electrification and high-precision measurement by setting an ROI 903 for a low-speed scan area (high-efficient secondary electron detection area), scanning the area at a low speed, and scanning the other area at a high speed is suggested. The ROI 903 is selectively scanned at a low speed (an area other the ROI 903 is scanned at a relatively high speed), so that the ROI enabling the high-precision measurement can be inserted into an image schematically representing a measurement target pattern.

For the scan speed in the ROI, a condition where a height difference of a bottom and a peak of a profile waveform becomes larger than a predetermined value (first threshold value) may be selected. In addition, a condition where the height difference of the bottom and the peak is not more than a predetermined value (second threshold value) not to perform excessive beam irradiation on the ROI may be set.

According to this embodiment described above, an area where a number of signals need to be acquired is scanned at a low speed and the other area is scanned at a low speed, so that both high precision of desired measurement or inspection and suppression of effects from electrification can be realized.

Figure 10:
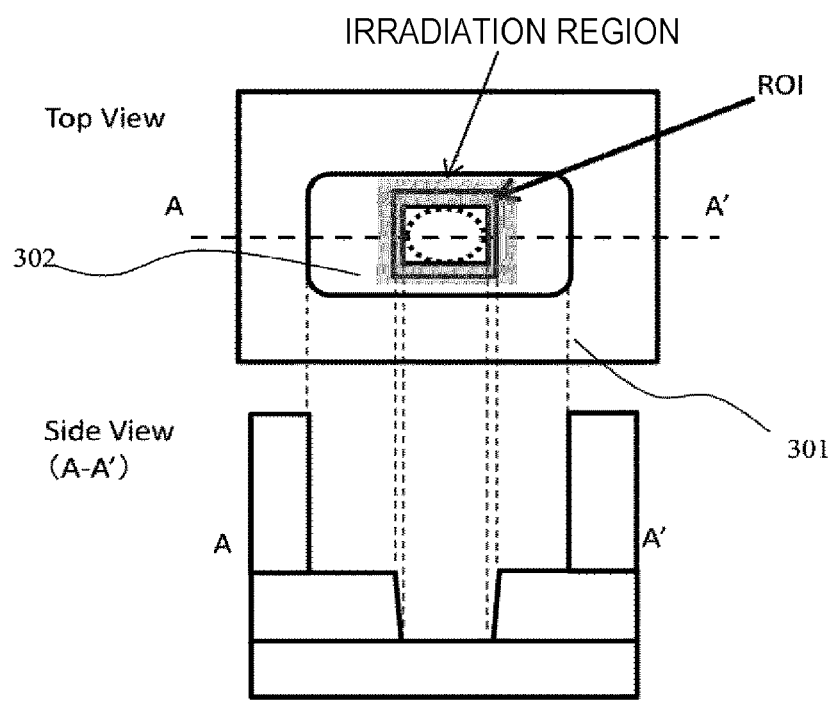
FIG. 10 is a diagram illustrating an example of forming an image by performing beam irradiation in the ROI.
Figure 10:
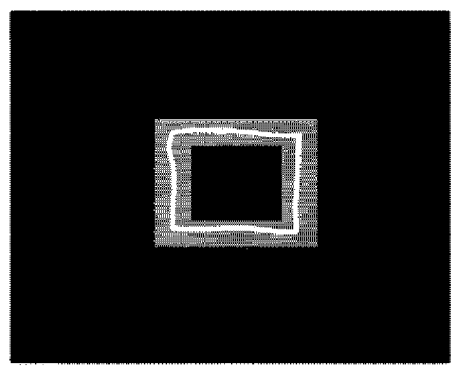

FIG. 10 illustrates an example of forming an image by irradiation of only an ROI of a sample. If magnification and a pixel number are determined after addressing of an observation pattern, an existence area of the ROI can be determined. The operator applies constant likelihood previously on the GUI and designates an irradiation area, so that information of only the ROI is obtained. At this time, an image is output at the same magnification as normal whole surface scan, so that measurement of the ROI can be performed. Such observation is effective for the sample in which the electrification or the shrinkage (damage) is notable.

REFERENCE SIGNS LIST 1 electron source
2 electron beam
3 condenser lens
4 deflector
5 objective lens
6 sample
7 secondary electron
8 detector

The invention claimed is:

1. A charged particle beam device for generating an image of a sample, comprising:
   a charged particle source for generating a charged particle beam;
   a deflector that scans the sample with the charged particle beam emitted from the charged particle source;
   a detector that detects a charged particle obtained upon irradiation of the sample with the charged particle beam;
   a computer system that processes an output of the detector and controls the deflector; and
   a graphical user interface that displays a setting field for setting a condition of beam irradiation, and also displays a display field for displaying at least one of layout data and the image generated based on the output of the detector,
   wherein:
   the graphical user interface is configured to allow a plurality of areas to be set on at least one of the layout data and the image, and
   the computer system controls the deflector so as to execute a beam scan based on the condition that has been set on the graphical user interface.

2. A charged particle beam device for generating an image of a sample, comprising:
   a charged particle source for generating a charged particle beam;
   a deflector that scans the sample with the charged particle beam emitted from the charged particle source;
   a detector that detects a charged particle obtained upon irradiation of the sample with the charged particle beam;
   one or more computer systems that controls the deflector and generates the image of the sample based on an output of the detector; and
   a graphical user interface that displays a parameter space and allows a user to select an operation parameter of the charged particle beam device,
   wherein:
   the parameter space includes a dimension, and
   the graphical user interface is configured to display an inside of the parameter space with the dimension in an identifiable manner in accordance with a signal of the image when the sample is scanned with the charged particle beam.

3. A charged particle beam device for generating an image of a sample, comprising:
   a charged particle source for generating a charged particle beam;
   a deflector that scans the sample with the charged particle beam emitted from the charged particle source;
   a detector that detects a charged particle obtained upon irradiation of the sample with the charged particle beam;
   one or more computer systems that controls the deflector and generates the image of the sample based on an output of the detector; and
   a graphical user interface that displays a setting field for setting a beam irradiation of the deflector, and also displays a display field for displaying at least one of layout data or the image generated based on the output of the detector,
   wherein:
   the graphical user interface is configured to allow a plurality of areas to be set on at least one of the layout data or the image, and
   the one or more computer systems controls the deflector based on a condition that has been set on the graphical user interface.

* * * * *